United States Patent [19]

Kuehnle

[11] 4,151,064

[45] Apr. 24, 1979

[54] APPARATUS FOR SPUTTERING CYLINDERS

[75] Inventor: Manfred R. Kuehnle, Lexington, Mass.

[73] Assignee: Coulter Stork U.S.A., Inc., Chicago, Ill.

[21] Appl. No.: 864,378

[22] Filed: Dec. 27, 1977

[51] Int. Cl.$^2$ ............................................. C23C 15/00
[52] U.S. Cl. ..................................... 204/298; 118/33; 118/218; 118/320; 118/416; 118/503
[58] Field of Search ........... 204/192 R, 192 C, 192 P, 204/298; 118/503, 320, 218, 416, 49.1, 49.5, 33; 269/48.1, 49; 101/127.1

[56] References Cited

U.S. PATENT DOCUMENTS

| | | | |
|---|---|---|---|
| 2,233,070 | 2/1941 | Atwell et al. | 118/503 |
| 2,721,535 | 10/1955 | Zitkus | 118/503 X |
| 3,556,004 | 1/1971 | Mitter et al. | 101/116 |
| 3,649,502 | 3/1972 | Herte et al. | 204/192 |
| 3,650,737 | 3/1972 | Maissel et al. | 96/1 PC |
| 3,818,982 | 6/1974 | Wagner | 165/86 |
| 4,014,779 | 3/1977 | Kuehnle | 204/298 |

Primary Examiner—Aaron Weisstuch
Attorney, Agent, or Firm—Silverman, Cass & Singer, Ltd.

[57] ABSTRACT

Apparatus for sputtering printing or similar type cylinders by means of r.f. sputtering in which a cylindrical metal substrate is mounted on a mandrel which is installed in a sputtering chamber. The apparatus includes targets arranged around the cylindrical substrate, the substrate comprising the anode or being mounted on the anode. The sputtering operation is arranged to apply a highly uniform coating of a photoconductive material on the substrate and the structure is arranged so that the finished cylinder can be removed from the sputtering chamber along with the mandrel and replaced by another metal cylindrical substrate on another mandrel. In this way a printing cylinder comprising a seamless thin-walled metal sleeve having a coating of photoconductive material is easily produced economically and rapidly, said coating having uniform thickness and properties throughout.

15 Claims, 7 Drawing Figures

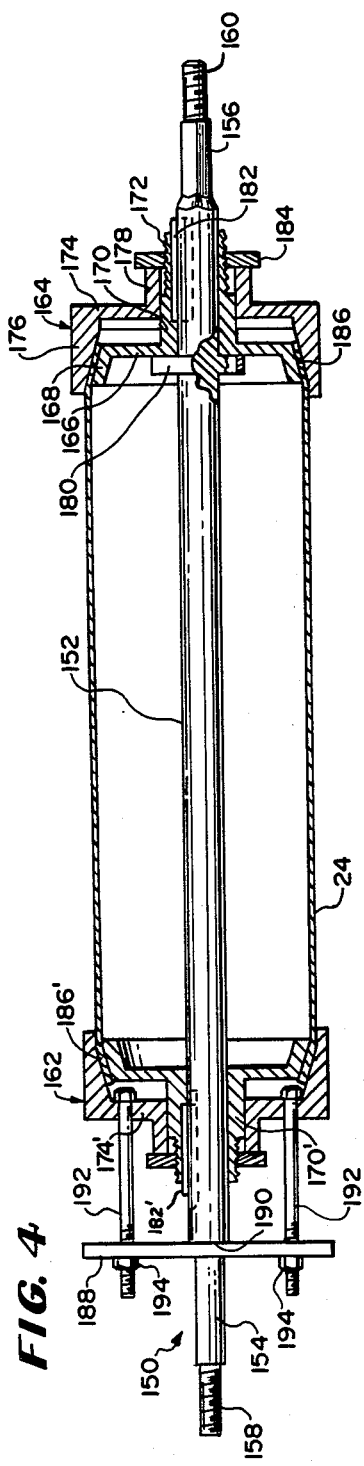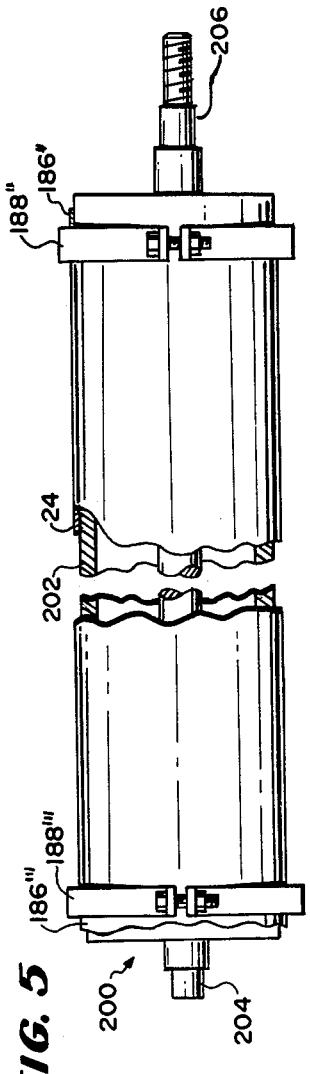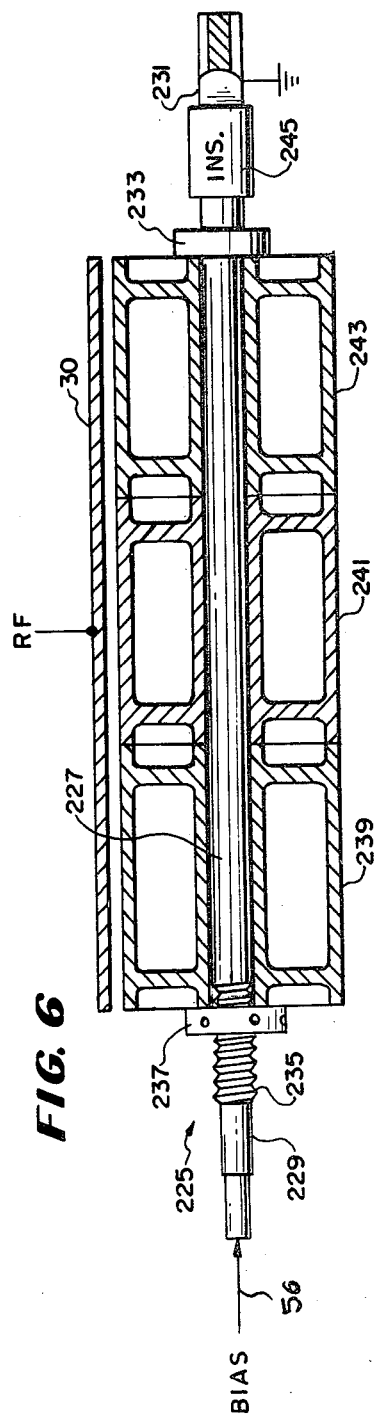

APPARATUS FOR SPUTTERING CYLINDERS

FIELD OF THE INVENTION

The general field of the invention comprises sputtering apparatus and more particularly the invention is concerned with apparatus for sputtering a photoconductive or similar coating onto a cylinder whereby to achieve a seamless member of a continuous substrate having such a coating on its surface, the coating having uniformity in all respects, i.e. physical, chemical, crystallographic and electrical.

BACKGROUND OF THE INVENTION

Sputtering apparatus has been known for a considerable period of time for use in sputtering metals and in some instances insulators onto substrate members of relatively small size. Only in recent times has the technique been extended to the sputtering of photoconductive materials. Likewise it is only in recent times that the type of apparatus has been evolved which enables sputtering of large quantities of material for production purposes. For example, sputtering of electrophotographic film which is a meter or more in width and several hundred meters long is a practical achievement through the use of the sputtering methods and apparatus disclosed in U.S. Pat. Nos. 3,829,373; 3,884,787; 3,905,887; 4,013,539 and 4,026,787.

Sputtering generally comprises the deposition of material by establishing an electrical plasma condition in a pressure vessel between a target or cathode made of the material which is to be deposited and an anode upon which the material is to be deposited. A high energy r.f. power source is coupled to the target and anode and an inert gas of high atomic weight such as argon is introduced into a low pressure chamber which houses the target and the anode so that the argon will be ionized and the heavy ions bombard the target. This literally drives particles of the target material out of the target into the gap between the target and anode, these particles being molecules of the target material, the established field or fields between the two electrodes causing the particles to be driven to the anode and deposited thereon. A substrate member of some material, which can be metal or an insulator such as polyester, overlying the anode will alternately receive the sputtered particles as a deposit. This deposit can be built up to thicknesses which depend upon the conditions within the chamber, the materials involved, the time of sputtering and other parameters such as power, temperature, gas pressure, etc.

The particular kind of apparatus which is discussed in the above mentioned patents is especially intended for the deposit of a crystalline coating of a photoconductive material of cadmium sulfide or the like having unusual properties. The material itself and the special conditions of its manufacture are disclosed in the U.S. Pat. No. 4,025,339.

This invention is especially concerned with the deposition of this type of crystalline photoconductive material upon cylindrical substrates for use in different kinds of imaging apparatus, for example, convenience or office copiers, printing plate makers, printing presses and the like.

In the course of sputtering photoconductive materials of the type described and claimed in said U.S. Pat. No. 4,025,339 it has been found that the nature of the background gas and the manner of introducing the same relative to the targets is important. This is preferably effected through the use of apparatus of the type disclosed in U.S. Pat. No. 3,976,555. Another very important requirement in achieving the desired properties of the deposit is that the voltage on the anode must be different from ground. A.C. or D.C. bias may be supplied directly or indirectly. In the case of production apparatus, large rolls of polyester are designed to be coated by passing them over a rotary drum which comprises the anode. This drum must thus be insulated from the shielding in the chamber, must itself be shielded and must be properly mounted for rotation upon the framework of the apparatus. When this voltage difference exists there is a second dark space adjacent the anode that produces the desired results.

The problems of having the drum surface comprising the anode at a different potential than the shielding and walls of the chamber, which are at ground potential, are solved in one manner in the apparatus which has been described above by the expedients described in U.S. Pat. No. 4,014,779.

As previously mentioned, the invention herein is concerned with apparatus for making a cylinder which has an outer coating of the photoconductive material upon a substrate which may be insulating or metallic. The cylinder is required to be seamless and the deposit must be effected in apparatus which solves the problems that arise in connection with the deposit of the same coating on a continuous elongate sheet of substrate that can be led over a rotary cylindrical anode. The same background gas must be provided; the anode must be connected or mounted in such a manner as to produce the second dark space, the targets energized by r.f. power etc. The difficulties which arise are in connection with the solution of these and other problems for the economical and rapid sputtering of a cylinder.

One example of the problems lies in the fact that the cylinder is required to be easily installed and removed from the apparatus. Another example is that the cylinder must be properly supported during sputtering.

One type of cylinder which is required to be coated is a thin-walled cylinder of the type described in U.S. Pat. Nos. 2,287,122 and 3,354,519, comprising an electrodeposited or electroformed cylinder of nickel that is a small fraction of a millimeter in thickness and has a length of about two meters and a diameter of about a sixth of a meter. These cylinders are quite flexible and readily collapse, and yet, in order to be used for perfect printing, they must have a uniform photoconductive coating; hence they must be fully supported during sputtering to prevent non-uniformity of deposit. Another type of cylinder is one which is based upon a relatively rigid drum that can be mounted in a duplicating machine so that it can be repeatedly imaged, toned and the toner transferred by pressure and bias. The cylinder in this case must be capable of being quickly removed and installed in the apparatus. The cylinders to be coated according to the invention are imperforate.

The invention solves these problems and others in providing a compact and economical sputtering apparatus which is capable of sputtering a coating of a photoconductive material on a continuous cylinder in which the cylinder can be quickly removed or installed. All of the necessary conditions which must be met to achieve a deposit for example, like that of said U.S. Pat. No. 4,025,339 are provided in a novel manner.

SUMMARY OF THE INVENTION

Apparatus for sputtering a photoconductive coating onto a metal sleeve in which the sleeve may be a thin-walled metal sleeve capable of being configured to form a cylinder or a rigid drum-like member. The preferred form of the invention has the sleeve or cylinder comprising the anode in a sputtering device which is formed in a suitable metal vessel, there being target means and an anode coupled to an r.f. source. The anode is removably mounted on a shaft or mandrel which is readily installed into the vessel and readily removed therefrom. Means are provided for electrically connecting the anode into the circuit of the apparatus, preferably with a negative bias. In such case the vessel itself and all of the shielding surrounding the target means and the anode are at ground potential.

The vessel has all of the systems required for the necessary plasma to be formed in the gap between the target means and the anode, including the gas and vacuum systems, coolant systems, heat exchange liquid systems if needed, electrical systems, etc.

The anode preferably is formed by a suitable mandrel upon which the thin-walled metal sleeve is stretched in a rigid cylindrical configuration, either unsupported as by clamping the ends and pulling them apart, or supported upon a suitable drum which is expandable. In either case, the deposit occurs directly upon the anode which is later removed and itself used as a printing cylinder or the like. The same or a different mandrel is furnished with another sleeve and replaced into the vessel.

The anode may comprise plural rigid drums of metal which are mounted in a suitable shaft for sputtering, but also being readily removable. In such case it is feasible to string several such drums onto the same shaft end to end.

The anode may comprise a drum which is either permanently mounted in the vessel or removable therefrom, there being an insulating sleeve-like substrate member mounted on the drum and the deposit of photoconductive coating taking place on the substrate member. This member is then removed and becomes a flexible belt or the entire drum is removed and subsequently the sputtered sleeve removed from the drum.

The invention includes the construction of the mandrels for mounting the metal sleeves in rigid cylindrical configuration to enable their installation and withdrawal from the sputtering chamber.

The invention also includes apparatus in which several mandrels may be mounted with their sleeves for simultaneous sputtering at the same time.

BRIEF DESCRIPTION OF THE DRAWINGS

FIG. 4 is an axial sectional view taken generally through a demountable mandrel to illustrate a structure for mounting a thin-walled sleeve for sputtering according to the invention;

FIG. 5 is a fragmentary side elevational view of another form of mandrel for mounting a thin-walled sleeve for sputtering according to the invention;

FIG. 6 is an axial sectional view through still another form of mandrel for mounting relatively rigid walled cylinders for sputtering according to the invention and illustrating diagrammatically a portion of the electrical circuitry involved.

DESCRIPTION OF THE PREFERRED EMBODIMENT

Generally the invention revolves around the concept of sputtering a cylinder within a sputtering chamber under special conditions and in accordance with special electrical requirements, but at the same time mounting the cylinder in such a manner that it is easily removed or installed within the chamber.

Figure 1:
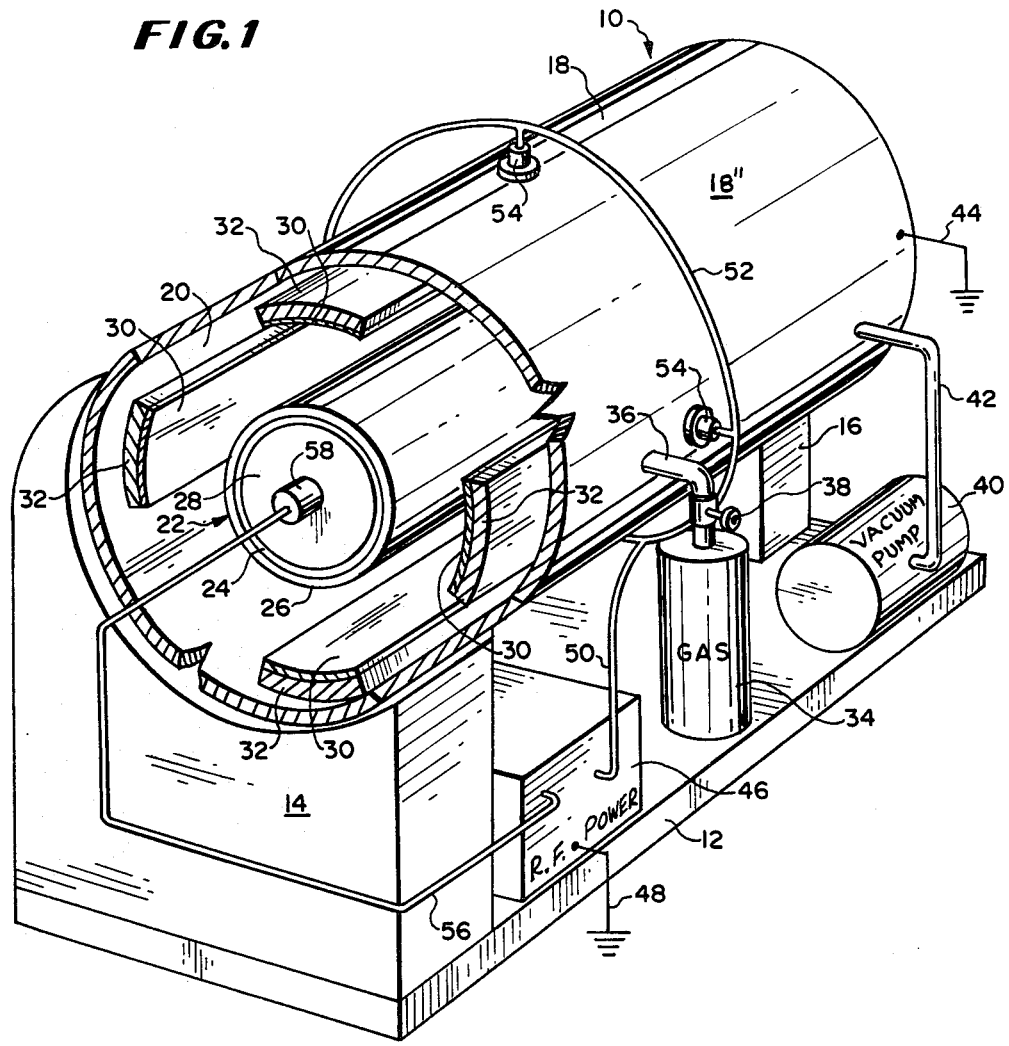
FIG. 1 is a diagrammatic perspective view illustrating the principles of the invention.

FIG. 1 is a diagrammatic perspective view which is highly simplified in which the principles of the invention are illustrated and can be explained. The dimensions and proportions are not necessarily correct but, from the knowledge of the art which is, for example, embodied in the U.S. Patents mentioned hereinabove, those skilled in the art will understand the practical application of the principles. This will be enhanced by the other illustrations and descriptions accompanying the same.

Figure 2:
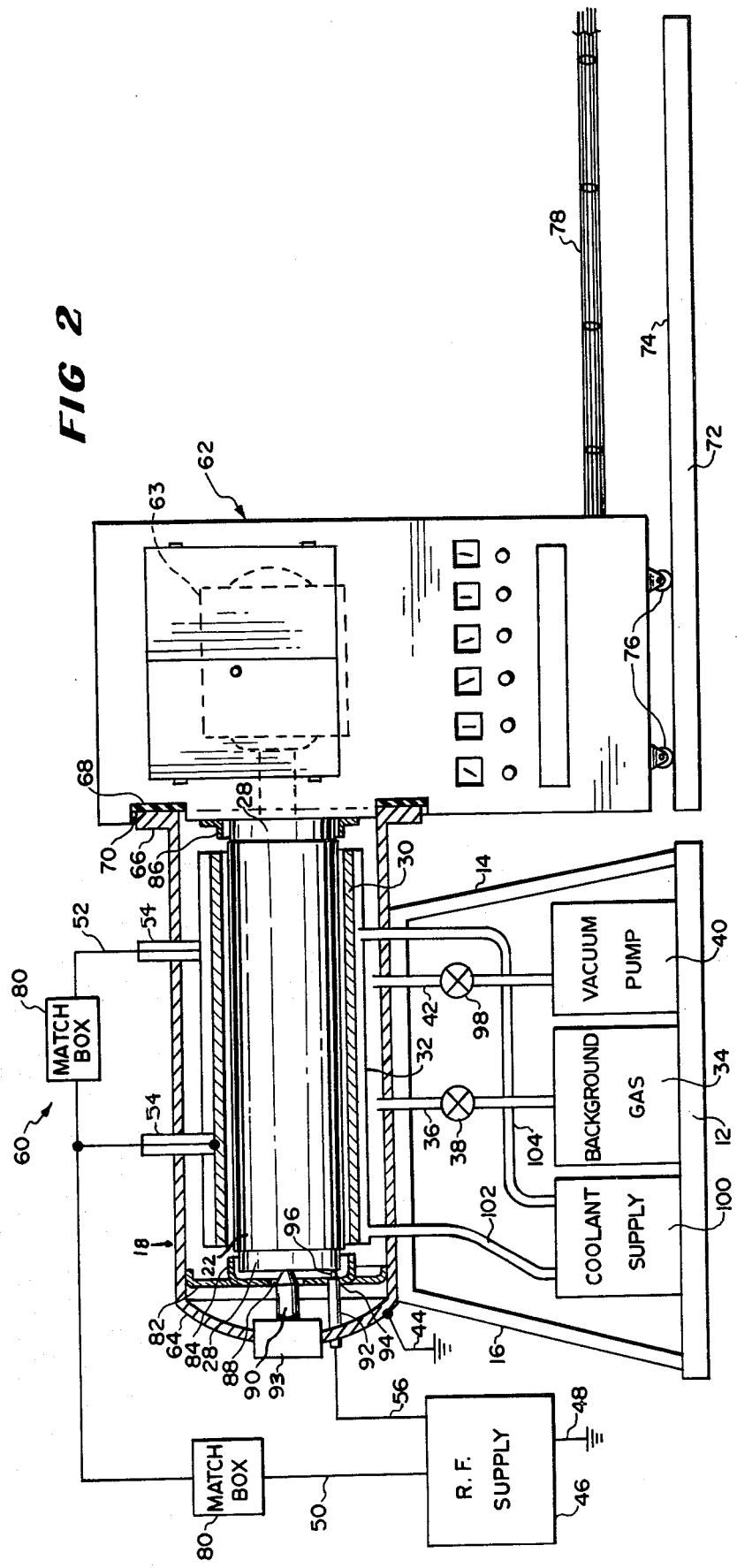
FIG. 2 is a combined generally axial sectional view and block diagram, but also diagrammatic of one proposed form of the invention.

The apparatus of FIG. 1 is designated by the general reference 10 and is shown to comprise a base 12 having front and rear standards 14 and 16, respectively, which support a pressure vessel 18 of generally cylindrical configuration, providing an interior sputtering chamber 20. The front end of the vessel 18 is broken away to show its interior chamber 20, but it is to be understood that this end provides easy access to the interior by way of a removable closure of some kind to enable the installation or removal of the cylinder or sleeve which is to be coated, as will be explained. In the figure there is a view of the printing cylinder and its mounting in which the dimensions are quite exaggerated. The wall of vessel 18 may be considered a sidewall 18", while the end wall 64 is illustrated in FIG. 2.

The cylinder 22 which is called a printing cylinder for convenience is formed of two parts, an interior substrate member 24 and the exterior photoconductive coating 26 which has been deposited onto the substrate member. The printing cylinder 22 starts out as the naked substrate member 24 which is a cylinder of metal or conductively coated insulating material. Since the invention is especially intended to provide metal cylinders coated with the photoconductive material, illustrations and explanations will be directed to structure intended to handle metal substates, but the modifications to the invention to enable the coating of insulating cylinders will be apparent from the principles detailed. Further, although mentioned as a printing cylinder, the cylinder 22 could be used for imaging in copiers, plate makers and the like.

The cylinder 24 is shown mounted onto a metallic mandrel, drum or core 28 that is driven by suitable means (not shown) in the chamber 20 during the coating operation. The preferred form of the invention contemplates that the entire cylinder 24 and mandrel 28 can be removed when the coating is completed, another cylindrical substrate member 24 mounted on the mandrel 28, and the assembly returned to the chamber 20. This procedure can be accomplished easily and quickly with a removable mandrel 28.

The interior chamber 20 is provided with a series of arcuate targets or cathodes 30 that are spaced around the mandrel 28, being coaxial therewith. These targets 30 are formed of the material from which the coating 26 is to be made and will comprise the material sputtered by way of the plasma formed across the intervening gap between the exterior of the cylinder 22 and the inner surfaces of the targets 30. Each target is mounted on a suitable support 32 which is shown solid in the view of FIG. 1 for convenience but which could be hollow to enable the admission of background gas, could carry coolants and could provide for mechanical mounting and adjustment of the target. The targets 30 could be formed of small plates which have flat planar surfaces and are cemented together to provide generally arcuate surfaces; they could be substantially continuous around the cylinder 22 instead of spaced in segments; they could comprise more or less than the four shown. The space or radial gap between target surface and the exterior surface of the substrate cylinder 24 is very narrow, say of the order of several centimeters for large devices handling cylinders that are a third of a meter or so in diameter. Thus, the dimension of the gap which is illustrated is exaggerated to make the illustration easier to follow. The electric ionizing plasma forms in this gap.

The mountings for the targets 30 and the connections to supplies of coolant for them as well as the conduit system for the background gas are not shown. Instead, for symbolic purposes a tank of gas is shown at 34 carried on the base 12 and connected through a conduit 36 by way of a valve 38 to the interior chamber 20 through the wall of the vessel 18. Distribution of this gas and its composition are described in the patents which are mentioned above. It is clear that several tanks of the background gas may be needed, such as for example a tank of argon for the ionized plasma and a tank of hydrogen sulfide in the case that the coating 26 will be crystalline cadmium sulfide of the special morphology described in U.S. Pat. No. 4,025,339. In such case the material of the targets 30 will be extremely pure cadmium sulfide, with or without dopant.

When the apparatus 10 is operated a high vacuum must initially be drawn in the chamber 20 and to some extent thereafter the vacuum pump must continue to be operated. A symbolic vacuum pump apparatus is shown at 40 mounted on the base 12 and connected to the chamber 20 by the conduit 42 passing through the wall of the vessel 18.

The technique for depositing a crystalline coating 26 on the cylindrical substrate 24 calls for the formation of a so-called second dark space or Langmuir probe alongside of the anode (the first dark space being Crooke's dark space at the cathode). This is preferably effected by applying a low voltage A.C. or D.C. bias on the anode. This means that while the cathode or target is at a high value of negative voltage and all of the shielding around the target and anode (not shown in this view) are at ground potential, the anode itself is slightly negative relative to ground. Thus assuming that the vessel 18 represents the shielding since it is rarely not made of metal, there is a ground connection at 44 placing the vessel wall and shielding at ground potential. The radio frequency power supply is shown symbolically at 46, mounted on the base 12 and grounded at 48. Its high voltage transmission line 50 is connected by way of the harness 52 to each of the targets 30 through suitable insulating mountings such as 54, the electrical connections passing through the wall of the vessel 18.

The low voltage bias connection to the anode, which will comprise the metal cylinder 24 and metal mandrel 28, is provided by an electrical connection 56 extending from the r.f. power supply 46 or other bias source through the end of the vessel 18 (which is not shown) into engagement with a trunnion 58 of the mandrel 28 which it contacts in a sliding or wiping connection. It is assumed that the mandrel 28 is otherwise mounted in such a manner that it is insulated from the vessel 18.

It is pointed out that the structure which has been shown and illustrated is just vestigial since the apparatus will be considerably complex when sputtering large objects using target areas of several square meters and more. The r.f. power supply must be matched to each of the targets individually and all connections adjusted for maximum power transfer. Likewise the mechanism for mounting and driving the mandrel, for providing the necessary controls and operation and the like will be relatively complex but known to those skilled in this art. Vacuum and gas control equipment are considerably more involved than would be inferred from the simple illustration.

FIG. 2 shows an apparatus 60 which is closer in its details to a practical structure than FIG. 1 but which nevertheless is also symbolic and diagrammatic in most respects. There is a common use of reference numerals where feasible throughout all of the drawings in order to provide an indication of the same or equivalent components, but not by way of limiting the illustrations to the same structures. Often the same reference characters will be primed.

FIG. 2 shows the apparatus 60 comprising two principal parts, one being the vessel 18 and its support together with all of the liquid, gas and electrial systems connected thereto, and the other being the control cabinet 62. The control cabinet has much of the instrumentation required to monitor the operation of the apparatus 60, the driving means 63 for rotating the mandrel 28 and will have other equipment and accessories which may relate to the systems illustrated symbolically. The vessel 18 is preferably fixed on its base 12 and supports 14 and 16 and has a closed bell-like end 64 and an open end defined by the flange 66 on the right. The flange 66 is adapted to seat on a suitable gasket 68 provided in the recess 70 formed in the cabinet 62. This provides the closure for the chamber 20. The cabinet 62 has a base 72 comprising a track 74 upon which the cabinet 62 can roll through the medium of the rollers or wheels 76. The harness or assembly of cables, conduits, etc indicated at 78 is flexible and connects with outside power sources, with the systems of the chamber 18, etc. Means (not shown) are provided to lock the cabinet 62 against the flange 66 when the apparatus 60 is operating.

In FIG. 2, the r.f. power supply is shown connected to the targets 30 through match boxes 80 for indicating that the manner of feeding power to the targets is not simple. Some of the shielding for the cylinder 22 is shown. At the left hand end there is a shielding member 82 that is mounted just inside of the end bell 64 and having an annular flange 84 which, together with the axially facing portion of the member 82 closely shields the end of the mandrel 28. A similar member 86 mounted on the face of the cabinet 62 shields the right hand end of the mandrel 28 where it is coupled to the cabinet 62 to be driven. These structures are here illustrated merely as examples of the type of shielding which is required, not as limiting.

The member 82 has a central passageway 88 through which there is extended a stub shaft 90 or a type of pivot member which is carried by a large end bearing or trunnion 92 mounted in the end bell 64. This arrangement is for the purpose of enabling the mandrel 28 and the mounted substrate cylinder (not shown in FIG. 2) to be installed on a suitable connection with the cabinet 62 and moved to be engaged on the shaft 90 as the chamber 20 is closed and sealed.

The end bell 64 has a permanently mounted holder 93 which extends through another passageway 94 in the shielding member 82 to bring a wiping contact 96 into electrical engagement with the mandrel 28 to provide the bias for the anode as described if a direct bias connection is used. Bias may be achieved by "floating" the anode electrically.

Again there is a gas supply 34 providing the background gas through the conduit 36 and valve 38 and a vacuum pump 40 connected to the chamber 20 through the conduit 42 and a valve 98.

In this structure there is illustrated a coolant supply 100 mounted on the base 12 and connected to the bases 32 of the targets 30 by way of the system conduits 102 and 104. The mountings 54 here shown may provide several functions besides insulating lead-ins for the targets 30. They may provide the mechanical support for the targets and be adjustable; they may provide the inlets for the coolant; they may have tuning components therein; etc.

Figure 3:
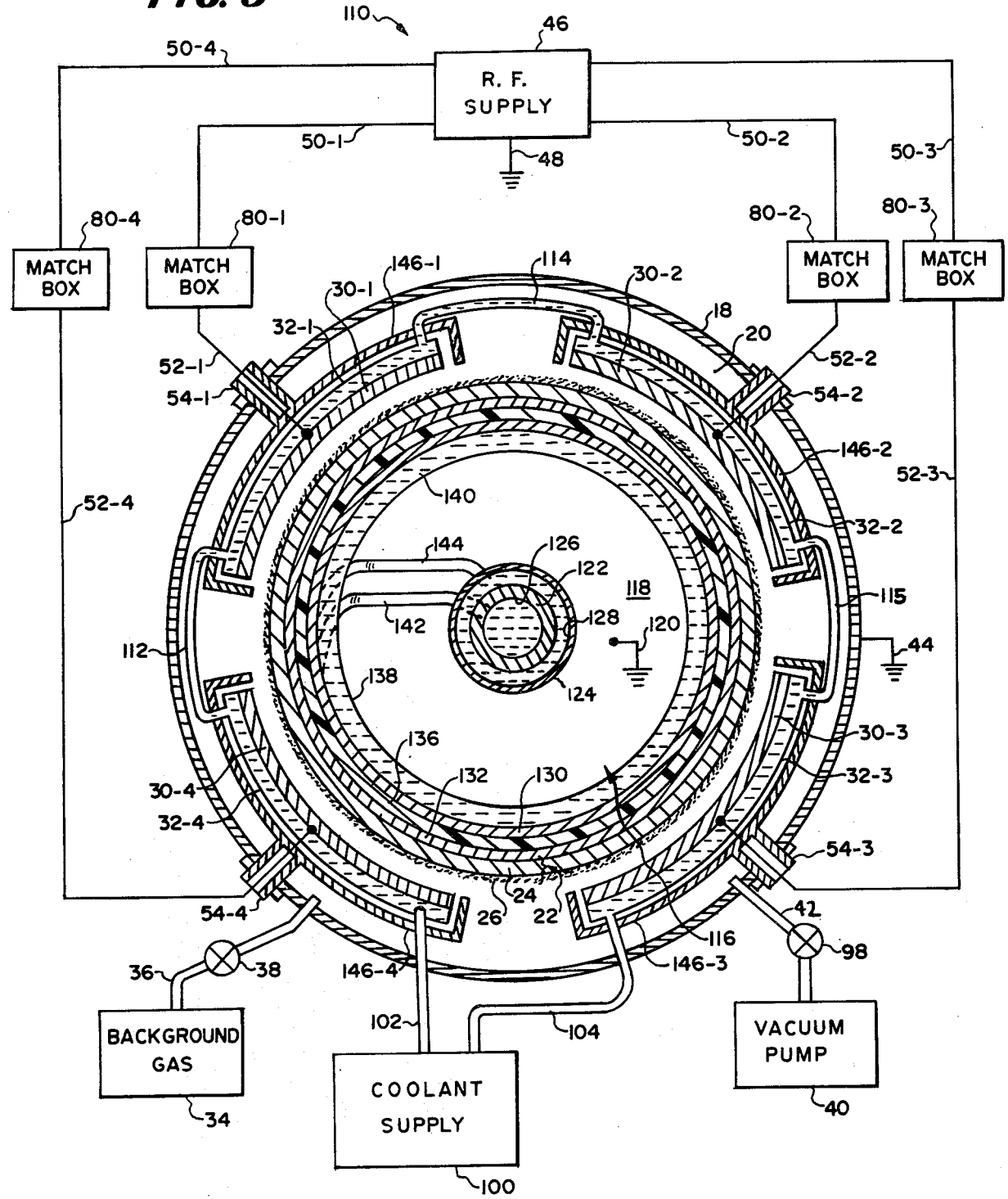
FIG. 3 is a combined generally transverse sectional view and block diagram of the form of the invention of FIG. 2 but not intended as an exact section therethrough in order to enable the illustration of certain details.

FIG. 3 illustrates a transverse sectional view through an apparatus 110 which, while still diagrammatic in nature, nevertheless illustrates additional details of a device constructed according to the invention for the purpose of coating cylinders. In this instance, the cylindrical substrate may be of a type which can be removed or installed upon an existing drum or mandrel instead of including the mandrel. This gives an opportunity of building the apparatus more like that of U.S. Pat. No. 4,014,779 wherein the anode or drum is permanently mounted to the cabinet and can have internal heat exchange means connected with a suitable source in the cabinet with fluids passing through the shaft for heating or cooling the anode skin.

In FIG. 3 one can see the vessel 18 with its interior chamber 20, there being support means 54-1, 54-2, 54-3 and 54-4 for the four targets 30-1, 30-2, 30-3 and 30-4, respectively, extending through the wall of the vessel 18. All of the functions required to be performed by way of supplying background gas; providing r.f. power input; circulating coolant to the target bases 32-1, 32-2, 32-3 and 32-4; pumping down the chamber 20; and the like are here provided by the same or similar apparatus. In the case of the r.f. supply 46, there are more details here to show that each target must be driven through its own match box 80-1, 80-2, 80-3 and 80-4. In the case of the coolant supply 100 and its conduits 102 and 104, the circulating system is here shown with interconnecting couplings 112, 114 and 115 between the several target bases.

In this structure, the anode comprises a drum which is generally designated 116 formed of an end plate 118 which is grounded at 120 mounted on a hollow shaft 122 having an outer cylindrical coaxial tube 124 coupled therewith. The arrangement provides two internal passageways 126 and 128 for carrying fluid. The drum 116 has an intervening insulating spacer 136 which may either comprise an insulating cylinder extending the entire axial length of the drum 116 or insulating end rings. This drum as defined is driven from a suitable source of rotary power within the cabinet or housing upon which it is mounted, as for example 63 (FIG. 2).

Within the interior of the inner metal cylinder 130 there is a manifold or series of turns of pipes 138 through which heat exchange liquid 140 may be circulted by means connecting conduits 142 and 144 that connect with the two passageways 126 and 128 respectively. The fluid can be any desired such as heated oil if the skin 132 is to be heated, or water if it is to be cooled. In the case of sputtering cadmium sulfide or similar material onto a polyester or other insulating substrate it is usual to provide internal heating of the drum 116.

The cylindrical substrate member 24 which is illustrated in this view shows the symbol of metal, but could be plastic or other insulating substance carrying a conductive coating. It is slipped onto the outer skin 132 of the drum 116 and rotated within the chamber 20 in order to be sputtered with a coating of the photoconductive material 26 to form the printing cylinder 22. If the substrate cylinder is polyester, for example, it would have to be provided first with a coating of ohmic material such as indium-tin oxide to enable charging during use, but where the substrate cylinder is metal as preferred, there is no need for an ohmic layer since the metal substrate cylinder such as 24 provides the same function.

The only other structure which is shown in more detail in FIG. 3 comprises the shielding for the targets. Such shielding is shown at 146-1, 146-2, 146-3 and 146-4 for the respective targets 30-1, 30-2, 30-3 and 30-4. All shielding is grounded.

Again it is pointed out that the targets can be made up of plates or plaques which are flat but arranged arcuately, they could be spaced closer together or have no spacing at all, etc.

FIG. 4 illustrates a structure for mounting a thin-walled sleeve 24 for sputtering on a suitable mandrel designated in this instance as 150. The cylinder is of nickel, copper plated nickel or even copper although nickel and the plated cylinders are normally preferred for printing because nickel as a base is tough, thermally stable and does not readily distort. The size of the cylinder can vary, but preferably for printing purposes the cylinder will have a length of two meters or more, and a diameter of about 20 centimeters to provide a total surface for printing of about two square meters. The thickness of these cylinders as manufactured by electrodepositing is about 0.15 to 0.25 millimeter. Of course, thicker walls can be utilized but are not needed for the printing presses contemplated with which these printing cylinders will be used.

The flexibility of the cylinder 24 means that once it has been formed even though formed as a cylinder, it may be shaped into configurations other than as a cylinder. It should thus be considered a sleeve in the broader sense, and indeed, once the coating 26 has ben sputtered onto the sleeve or cylinder 24 it can be shaped into a belt-like configuration with ends having a curvature substantially less than that of the cylinder in which shape it was formed. There will also be parallel sides connecting the arcuate ends.

A sleeve structure such as described could be used in office duplicators and it is likely that in such cases the ratio of the axial length of a cylinder as formed to its diameter would be much less than if the resulting coated member were to be used in a rotary printing press.

The cylinder or sleeve 24 when formed of electrodeposited nickel having a thickness of about 0.15 millimeter and a length and diameter as mentioned is flexible but can be handled without collapsing if one exerts care. Thus, it can be engaged upon holders and into flanges if sufficient space for movement is provided. By this it is meant that a small clearance requiring some sliding friction will not be objectionable.

The mandrel 150 is formed of a central rigid shaft 152 having spindle ends 154 and 156 of reduced diameter which may be polygonal to be engaged within the sputtering apparatus by suitable sockets, clamps or the like. In addition or instead of the polygonal spindles, there may be threaded stud ends at 158 and 160 to enable fastening nuts or the like to be secured to the shaft 152 during mounting. Each end of the shaft 152 is provided with clamping means to engage and hold the ends of the cylinder or sleeve 24. At least one of the clamping means is arranged to be axially adjustable to enable stressing the sleeve axially so that it is perfectly cylindrical and rigid during the sputtering operation whereby the sputtered coating 26 will be applied uniformly.

The clamping means of the mandrel 150 are designated 162 and 164 and are quite similar in construction and operation. The clamping device 164 comprises an interior disc member 166 having an annular exteriorly tapered flange 168 and a hollow integral spigot 170 with a threaded exterior at 172 cooperating with an outer disc member 174 also having an annular interiorly tapered flange 176 and a hollow sleeve part 178 coaxial with the spigot 170. An integral or secured washer 180 on the shaft 152 prevents axial movement of the clamping device 164 to the left. The inner disc member 166 is keyed to the shaft at 182 or otherwise prevented from rotating relative to the shaft and likewise the outer disc member 174 is constructed to prevent rotation relative to the inner disc member 166 and hence relative to the shaft 152. Disc member 174 should have axial movement capability. A large nut 184 engages the threaded end 172 so that taking up on the nut 184 brings the two disc members toward one another to cause their tapered flanges to clamp together. the right hand end 186 of the sleeve or cylinder 24 is engaged into the flange 176 on its interior while the assembly is loose after which taking up on the nut 184 tightly clamps the end 186 uniformly around the periphery thereof.

The clamping device 162 is constructed and operates as described with modification. The mounting of the left hand spigot 170' on the shaft 152 by means of the key 182' or similar means is such that when the left hand end 186' is clamped in place there is available axial movement of the clamping means 162 bodily along the shaft 152. A large plate or disc 188 which is engaged over the spindle 154 and is slidable thereon is incapable of sliding past the enlarged shoulder 190. It has a plurality of tie rods 192 which extend to the interior of the disc member 174'. These tie rods have nuts at 194 which enable the tie rods 192 to be pulled to the left when the nuts are taken up.

With both ends of the sleeve 24 clamped in place and the entire sleeve being tensioned by the application of force tending to pull the clamping means 162 and 164 apart the cylinder or sleeve 24 will be in a perfectly rigid cylindrical condition mounted on the mandrel 150.

The entire mandrel with the sleeve 24 can now be handled easily, installed in a sputtering apparatus such as illustrated in FIGS. 1, 2 or 3 and removed from such apparatus after coating with the outer photoconductive coating 26.

The plate 188 with connecting tie rods 192 comprises only one structure for tensioning the cylinder or sleeve 24 on a mandrel such as 150, but others could be used. For example another arrangement of an additional hollow bushing and a threaded nut could apply the force closer to the axis.

In FIG. 5 there is illustrated a simplified form of mandrel 200 for mounting the sleeve or cylinder 24. Here the mandrel 200 comprises a central cylinder 202 upon which the sleeve ends 186" and 186'" are clamped by simple C-clamps 188" and 188'", respectively. The ends of the cylinder 202 are provided with spindles 204 and 206 for mounting the assembly.

In this case, the cylinder 202 may be of a construction that is known in which the cylinder can be expanded diametrically after the sleeve 14 has been slipped over it while its diameter is small enough to accommodate the sleeve easily. The structures which are known comprise segmented and/or articulated members that can be expanded by cams or jacks.

In another instance, the cylinder may be one which is made of a metal which has a high Young's modulus. The mandrel 200 is then placed in a cooling chamber to cause the cylinder 202 to contract while the cylinder or sleeve 24 is heated above the temperature that it is likely to encounter during the sputtering process. In this condition the sleeve 24 is slipped over the cylinder 202 and clamped in place. When the temperature equalizes the sleeve 24 will tightly contract about the cylinder 202 which expands slightly and the mandrel can be handled easily. To remove the sleeve 24 once it has been coated, the cylinder 202 can be cooled by circulating cold water or cooled air on its interior while the exterior sleeve 22 with coating can be subjected to infrared heating lamps. When loose, the sleeve is slipped off the mandrel.

It is feasible to have a mandrel such as shown in FIG. 6 at 225 which mounts several cylinders, for example, of the type which are comprised of rigid metal drums having exterior coatings of the photoconductive material. Thus, the mandrel comprises a shaft 227 having end spindles 229 and 231 by means of which the mandrel 225 may be mounted in a sputtering chamber. The shaft has a fixed end washer 233 and a threaded section 235 at its opposite end which provides for engagement of a large nut 237. There are shown three rigid drums 239, 241 and 243, all of which are made out of a metal such as aluminum and may have been formed by machining or casting. Such drums are intended for use in duplicating machines and are to be coated with a layer of photoconductive material in apparatus such as those illustrated in FIGS. 1, 2 and 3. Each drum is hollow and has a central passageway which enables all of them to be engaged seriatim onto the shaft 227 and clamped in place by the nut 237. The metallic ends contact one another to provide the necessary condition for constituting the assembly of drums as the anode in the sputtering process. In the process of sputtering according to said U.S. Pat. No. 4,025,339 where a bias is necessary, the shaft 227 may be constructed with an intervening insulating sleeve 245 so that the right hand spindle end 231 can be grounded and the left hand spindle end 229 connected to a source of bias through the line 56. This same arrangement can be used in the mandrels 150 and 200 to provide bias. The disposition of the target 30 is illustrated with its r.f. connection.

Figure 7:
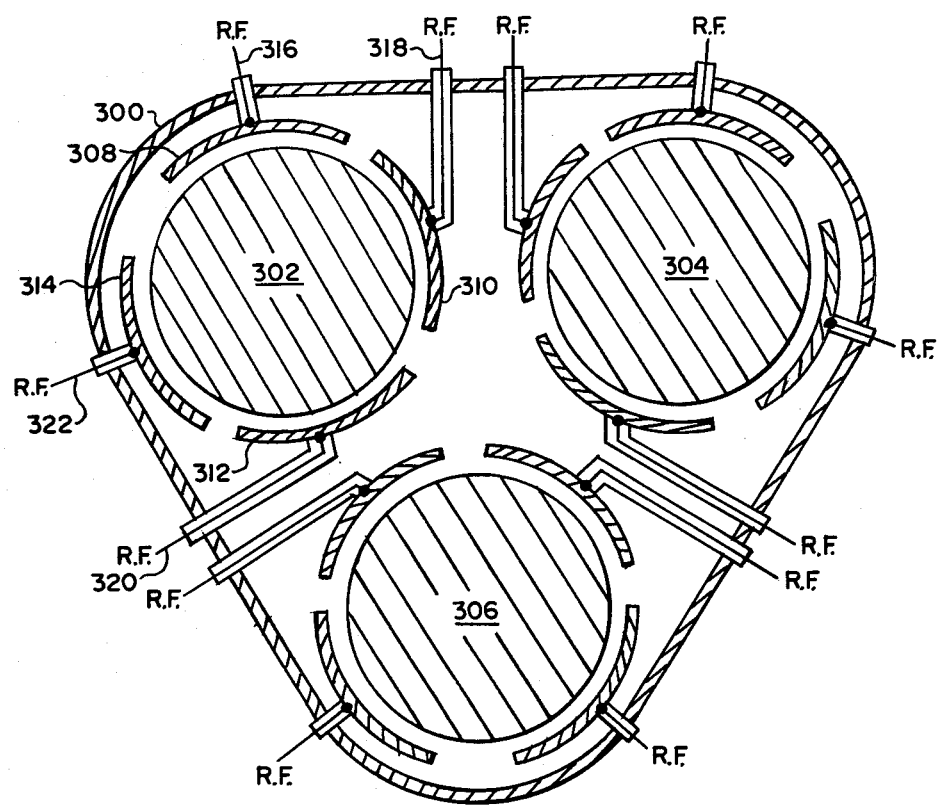
FIG. 7 is a diagrammatic sectional view through apparatus constructed in accordance with the invention and designed to sputter three cylinders simultaneously, the cylinders being arranged with their axes parallel and spaced apart.

In FIG. 7 there is illustrated a diagram showing the geometric arrangement for the sputtering of three cylinders of the type described above in which the cylinders 22 will be relatively elongate. In this instance the cylinders will be mounted with their axes parallel. The problem with sputtering in a situation where there are multiple elongate cylinders is that it is almost required from a practical standpoint that the targets be mechanically supported from the vessel walls so that the various electrical connections and other functional systems be led through the walls in a manner which will not be disturbed if the cylinders are installed or removed.

In the example of FIG. 7, the vessel 300 is generally triangular in cross section with three sputtering assemblies mounted therein. These are shown simply as circles at 302, 304 and 306 but will comprise all of the necessary details to enable cylinders such as 22 to be supported and sputtered. Mandrel construction and the various mountings will follow what has already been explained so that ideally, the mandrels may be installed and removed without disturbing any of the structure of the apparatus or any of the systems. The gas, vacuum, cooling, etc. systems are not here shown.

Each of the cylinders has its own set of targets, such as for example the targets 308, 310, 312 and 314 for the cylinder 302. All of the others have similar sets of targets. The targets are in each case mounted to the wall of the vessel 300 and each has its own r.f. lead such as at 316, 318, and 320 and 322 respectively, enabling tuning and/or balancing the targets individually to provide maximum power transfer to them.

The plasma which is produced between each target and the anode or substrate intervening will be essentially fully confined and proper shielding will further confine the plasma. Accordingly, the individual sputtering groupings will not interfere with one another while providing an economical and relatively speedy way of making the required cylinders. On the other hand, the same vacuum pumping system, coolant system, gas input system and various other systems can be used in a single apparatus. All three of the cylinders can be driven by the same mechanism at the same speeds to achieve uniform coatings. Measurements can be made with a minimum of effort and instrumentation.

It is believed that the invention has been explained in such detail as to enable those skilled in this art to understand and practice the same. Modifications and variations can be made without departing from the spirit or scope of the invention as defined in the appended claims.

What it is claimed and desired to secure by Letters Patent of the United States is:

1. Apparatus for sputtering a photoconductive coating onto a seamless sleeve of metal which comprises:
   (A) a sputtering vessel of metal having side wall means and spaced end walls, one of said end walls being separable from the adjacent side wall means and means for moving the side wall means and said one end wall relative to one another along a linear path between a closed position whereat a sealed sputtering chamber is defined within said vessel and an opened position whereat the said one end wall is spaced from the side wall means;
   (B) a mandrel and means associated with said mandrel for removably holding the sleeve in rigid cylindrical configuration, said sleeve otherwise being thin walled and normally collapsible, and shaft means associated with the mandrel disposed coaxially of the cylindrical sleeve configuration;
   (C) mounting means associated with at least said one end wall for supporting said mandrel shaft means and sleeve for uniform rotation of the mandrel and sleeve thereon about an axis parallel to said one end wall linear path, said mandrel and sleeve thereon being entirely outside of the chamber and accessible in the opened position of said one end wall and being entirely within the chamber in the closed position of said one end wall, and drive means engaged with the shaft means for rotating said mandrel and sleeve thereon when in said chamber,
   (D) target means formed of the photoconductive material defined as a plurality of arcuate segments defining together a coaxial cylinder slightly larger than said sleeve and means mounting the segments adjacent said sleeve and spaced therefrom across radial gaps of the order of several centimeters and said segments being spaced apart circumferentially of the sleeve and r.f. supply means coupled in matched circuits between said target means, sleeve and vessel to establish a sputtering condition and provide circumferentially spaced plasma belts in the chamber spanning the radial gaps between the target means and the sleeve said sleeve comprising an anode;
   (E) said mandrel and sleeve thereon being removable from cooperative relationship with said supporting means for said mandrel shaft means when mandrel and sleeve are outside of the chamber to allow for quick mandrel replacement without disturbing the target means in the vessel.

2. The apparatus as claimed in claim 1 in which means are provided to establish a low potential negative bias relative to ground on said anode during sputtering, said mounting means for supporting said mandrel shaft means being arranged to insulate the anode from the vessel, the vessel being metallic and maintained at ground potential and the target means being at a high negative potential relative to ground.

3. The apparatus as claimed in claim 1 in which there is a substrate on the exterior surface of the sleeve intervening between the sleeve and target means and the photoconductive coating is deposited onto the substrate.

4. The apparatus as claimed in claim 1 in which the photoconductive coating is deposited directly onto the metal sleeve and the means mounting the anode comprise a mandrel having the metal sleeve removably mounted thereon.

5. The apparatus as claimed in claim 4 in which means are provided to connect a low potential negative bias to said anode during sputtering, said anode mounting means being arranged to insulate the anode from the vessel, the vessel being metallic and maintained at ground potential and the target means being at a high negative potential relative to ground.

6. The apparatus as claimed in claim 1 in which the plasma belt establishing means comprise an r.f. power source connected across the target means and ground, there being means to bias the mandrel and its metal sleeve relative to ground.

7. The apparatus as claimed in claim 1 in which there is a plurality of separate target means in the vessel each having a separate anode, all anodes being driven by said driving means, each target means and its anode forming a separate sputtering system within the same chamber but operating together, each anode being mounted on a mandrel as aforesaid and each mandrel being removable from the chamber.

8. The apparatus as claimed in claim 7 in which the axes of the anodes are parallel with one another and spaced apart.

9. Apparatus for sputtering a photoconductive coating onto a seamless sleeve of metal and in which there is a sputtering vessel and a sputtering chamber is formed in the vessel, said apparatus including means within and without the vessel but acting together for establishing an r.f. plasma belt within the vessel, said means including cylindrically arranged target means coupled to an r.f. power supply, the plasma belt adapted to be formed coaxial with and adjacent the surface of said target means, the seamless metal sleeve arranged to comprise an anode spaced from and arranged on an axis parallel to the target means with its exterior surface passing through at least a portion of said plasma belt, and means are provided for rotating the anode and for removing the anode from the chamber for replacement, and means for holding the sleeve which comprises:

a mandrel having the sleeve mounted thereon to form the anode and including an elongate shaft, means for removably coupling the shaft to the rotating means and means for removably gripping the sleeve and maintaining same in a rigid cylindrical condition.

10. The invention as claimed in claim 9 in which the means for removably gripping the sleeve and maintaining same in rigid cylindrical condition comprise clamping means at opposite ends of the shaft clamping the opposite ends of the sleeve in a circular disposition of a diameter equal to the maximum diameter of the sleeve when arranged cylindrically.

11. The invention as claimed in claim 10 in which means are provided mechanically to exert axial tension on the sleeve.

12. The invention as claimed in claim 10 in which means are provided to move the clamping means apart to exert axial tension on the sleeve.

13. The invention as claimed in claim 9 in which the shaft of the mandrel is substantially smaller in diameter than the interior diameter of the cylinder defined by the sleeve whereby the cylinder is self-supporting between the ends thereof, said gripping means being at the ends and being configured cylindrically to shape the sleeve.

14. The invention as claimed in claim 9 in which the gripping means include a drum portion whose outer diameter is close to the inner diameter of the sleeve cylindrical configuration, the drum portion being contractible to enable the sleeve to be slipped onto the drum portion and thereafter being expandible frictionally to engage the sleeve in a cylindrical configuration.

15. The invention as claimed in claim 14 in which the gripping means also include clamps at the ends of the drum portion to engage over the ends of the sleeve to hold same onto the drum portion.

* * * * *